United States Patent
Chen

(10) Patent No.: US 7,998,557 B2
(45) Date of Patent: Aug. 16, 2011

(54) SHELL ASSEMBLY

(75) Inventor: Qi-Feng Chen, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 154 days.

(21) Appl. No.: 12/510,278

(22) Filed: Jul. 28, 2009

(65) Prior Publication Data

US 2010/0279052 A1     Nov. 4, 2010

(51) Int. Cl.
*B32B 3/28* (2006.01)
*B32B 3/10* (2006.01)
*B32B 1/00* (2006.01)
*B32B 23/02* (2006.01)
*B29C 65/00* (2006.01)
*A45C 13/06* (2006.01)

(52) U.S. Cl. ........ 428/167; 428/131; 428/177; 428/192; 156/87; 150/120

(58) Field of Classification Search .................. 150/120; 156/87; 428/40.1, 42.1, 131, 137, 157, 167, 428/177, 180, 192

See application file for complete search history.

(56) References Cited

U.S. PATENT DOCUMENTS

| | | | | |
|---|---|---|---|---|
| 4,312,186 A | * | 1/1982 | Reider | 60/754 |
| 4,489,119 A | * | 12/1984 | Ishige et al. | 428/167 |
| 4,566,923 A | * | 1/1986 | Mueller | 156/69 |
| 6,238,762 B1 | * | 5/2001 | Friedland et al. | 428/43 |
| 6,506,110 B1 | * | 1/2003 | Borisch | 454/184 |
| 6,911,243 B2 | * | 6/2005 | Sher et al. | 428/40.1 |
| 7,687,135 B2 | * | 3/2010 | Birk | 428/188 |
| 2007/0026196 A1 | * | 2/2007 | Ogawa et al. | 428/157 |

* cited by examiner

*Primary Examiner* — David Sample
*Assistant Examiner* — Kendra Keith
(74) *Attorney, Agent, or Firm* — Altis Law Group, Inc.

(57) ABSTRACT

A shell assembly includes a shell and an ornamental element attached to the shell. The shell includes a main body with an ornamental area, and a plurality of crossed grooves are defined in the ornamental area. A crossed portion of every two grooves defines a through hole. When the ornamental element is applied to the ornamental area of the main body, air between the ornamental element and the main body can be vented to outside the shell via the grooves and through holes.

11 Claims, 5 Drawing Sheets

SHELL ASSEMBLY

BACKGROUND

1. Technical Field

The disclosure relates to shell assemblies, and especially to a shell assembly having an ornamental element attached to the shell.

2. Description of Related Art

A collapsible device, such as a notebook computer or a clamshell mobile phone, generally includes a main body and a cover. Typically, to improve durability of the cover, a protective or ornamental film can be applied on the cover. However, it is difficult to apply the protective film without trapping air bubbles between the cover and the film, which damages the appearance of the cover and may make it easier for the film to be snagged by something and peeled off.

DETAILED DESCRIPTION

Figure 1:
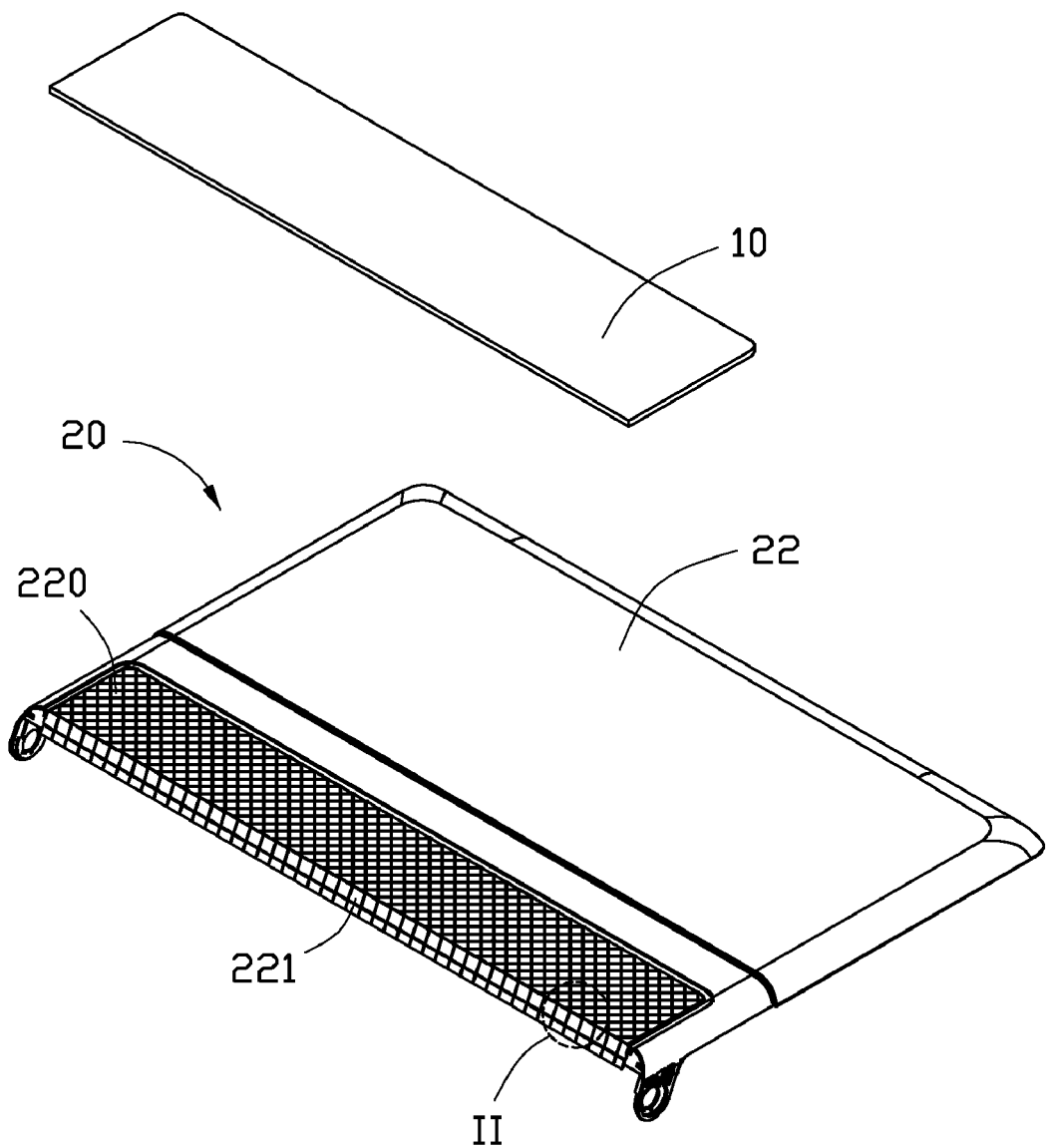
FIG. 1 is an exploded, isometric view of a first embodiment of a shell assembly, which includes a shell and an ornamental element.
Figure 2:
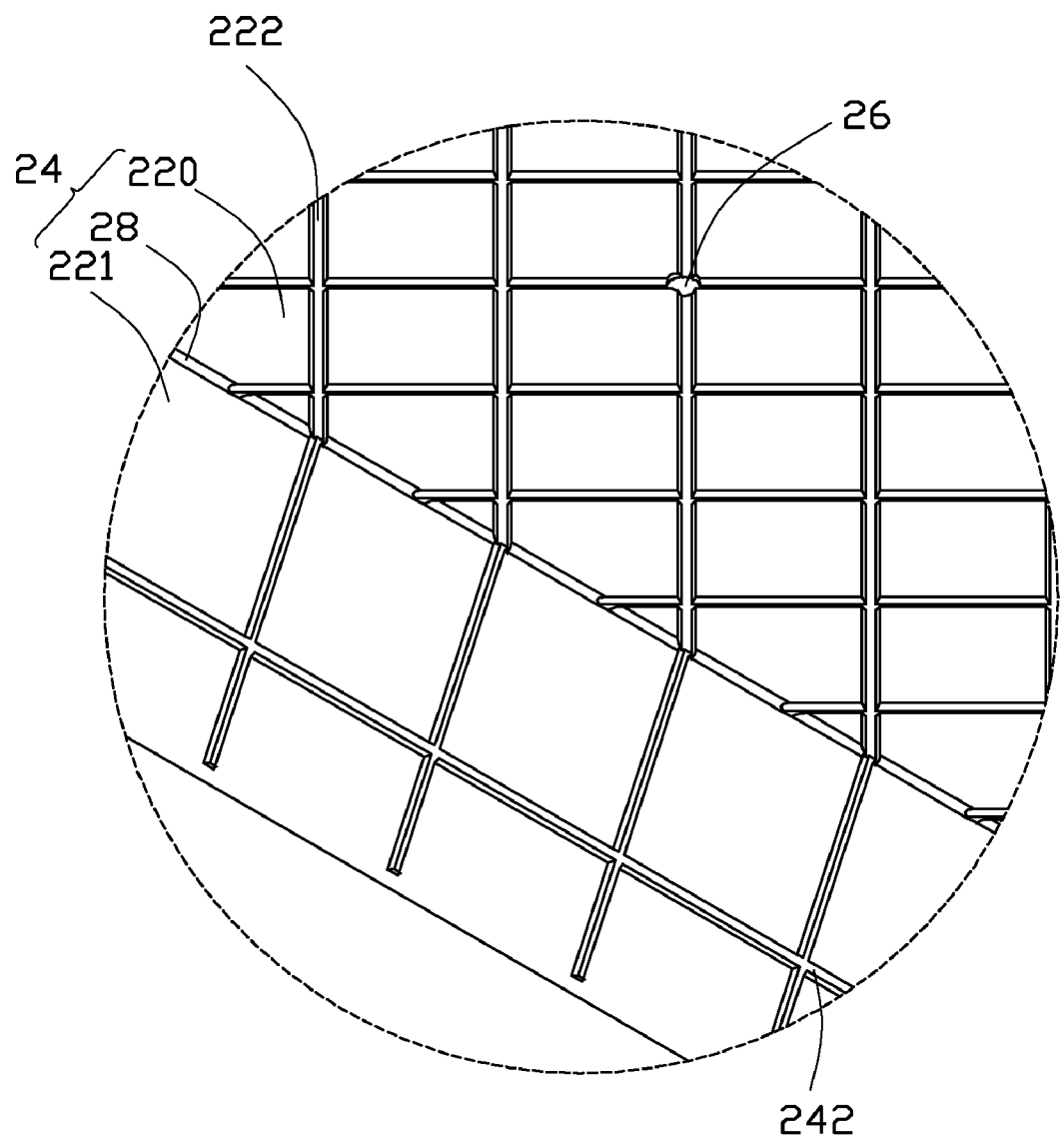
FIG. 2 is an enlarged view of the circled portion II of FIG. 1.

Referring to FIGS. 1 and 2, a first embodiment of a shell assembly includes a shell 20 and an ornamental element 10.

The ornamental element 10 includes an adhesive surface to be applied to the shell 20.

The shell 20 includes a main body 22 shaped like a board, and an ornamental area 24 is formed on a side of the main body 22. The ornamental area 24 includes a depressed portion 220 defined in the main body 22 adjacent to a side of the main body 22, a sidewall 221 slantingly extending from the depressed portion 220, and a connection portion 28 connected between the depressed portion 220 and the sidewall 221. A plurality of crossed grooves 222 are defined in the depressed portion 220 for exhausting air; the plurality of crossed grooves 222 form a grid-shaped structure. A crossed portion of every two crossed grooves 222 defines a through hole 26. The sidewall 221 defines a plurality of crossed slots 242 communicating with the corresponding crossed grooves 222.

Figure 3:
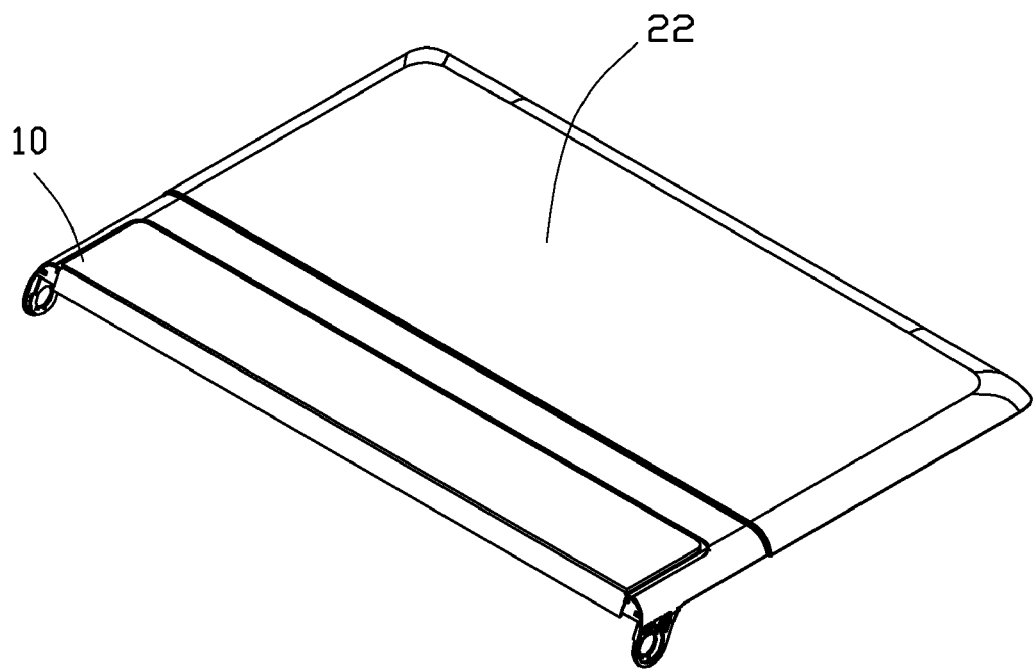
FIG. 3 is an assembled, isometric view of the shell assembly of FIG. 1.

Referring to FIG. 3, when the ornamental element 10 is applied to the shell 20, the adhesive surface of the ornamental element 10 contacts the depressed portion 220. The ornamental element 10 is pressed against the depressed portion 220, therefore, air between the depressed portion 220 and the ornamental element 10 flows into the plurality of crossed grooves 222. As a result, air can be vented to outside of the shell 20 via the plurality of crossed grooves 222 and the through holes 26.

An ornamental element can be applied to the sidewall 221, according to the above-mentioned method. In this process, air between the sidewall 221 and the ornamental element can be vented to outside the sidewall 221 via the plurality of crossed slots 242 and the through holes 26.

Figure 4:
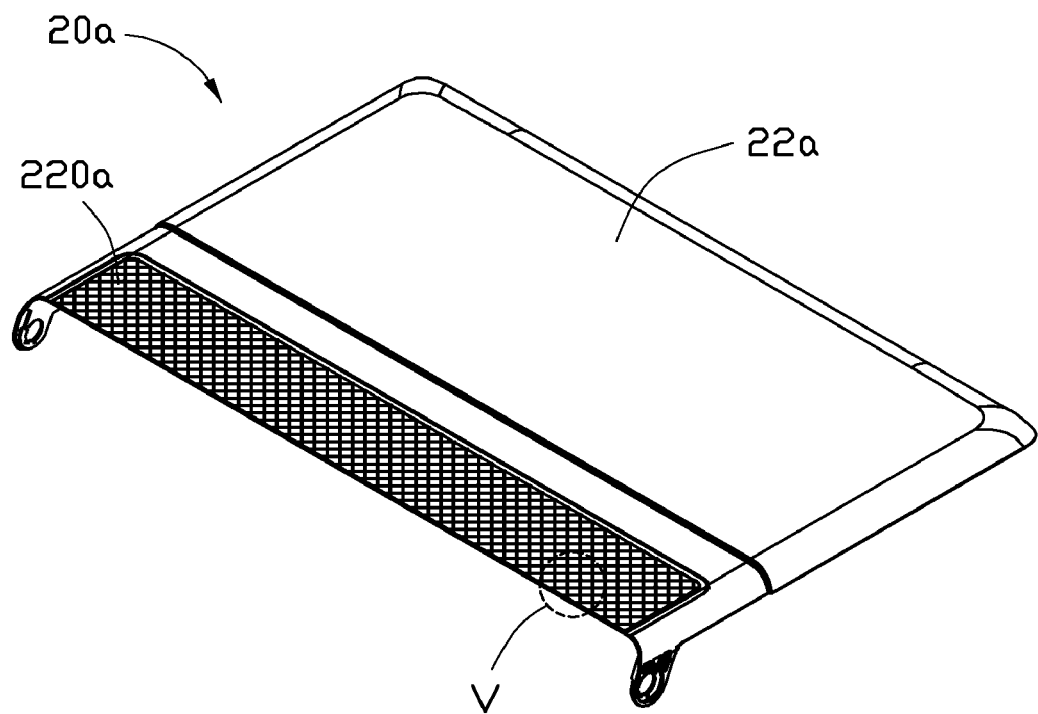
FIG. 4 is an isometric view of a second embodiment of a shell of the shell assembly.
Figure 5:
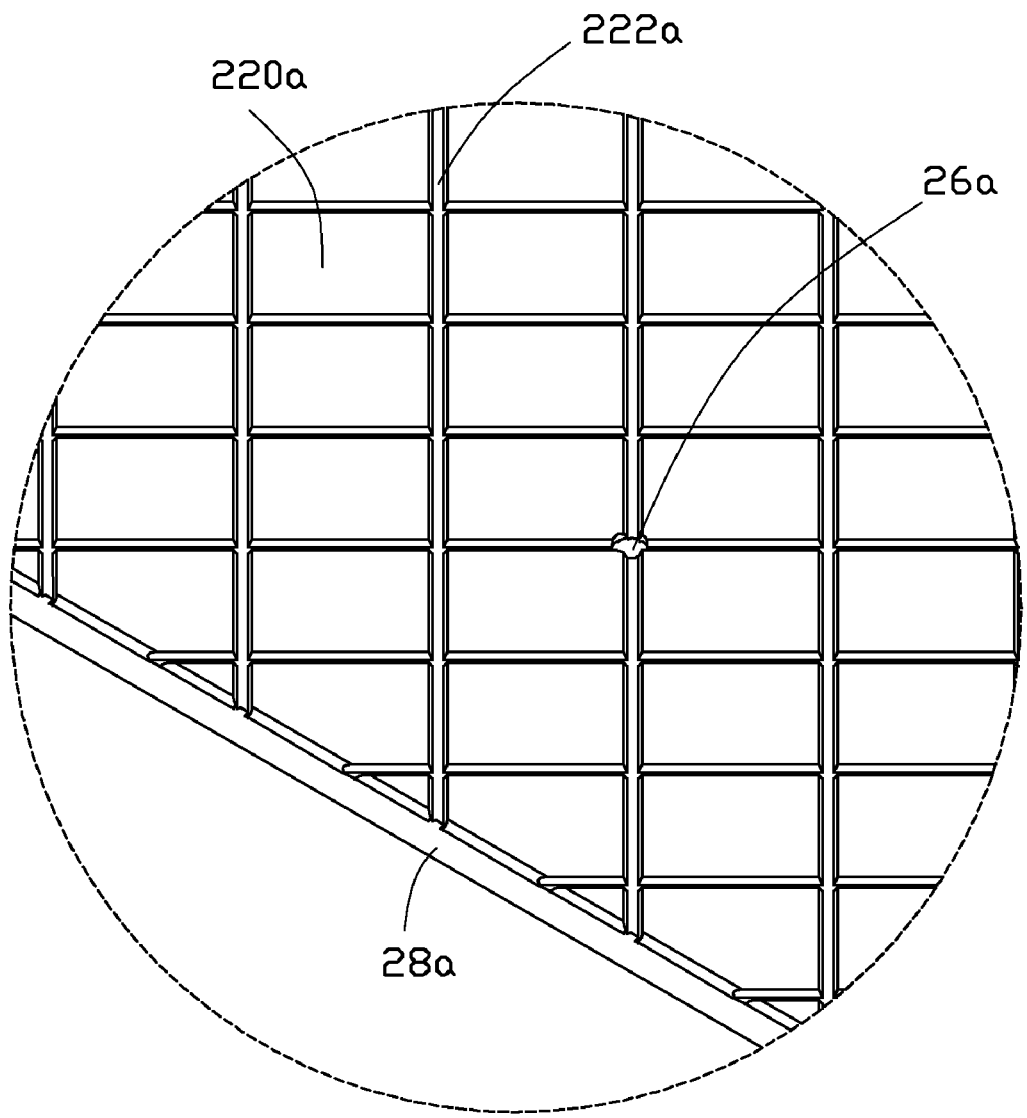
FIG. 5 is an enlarged view of the circled portion V of FIG. 4.

FIGS. 4 and 5 show a shell 20a of a second embodiment of a shell assembly. The shell 20a includes a main body 22a shaped like a board. The main body 22a defines a depressed portion 220a, adjacent to a first side of the main body 22a. A flange 28a is formed at an edge of the first side. A plurality of crossed grooves 222a are defined in the depressed portion 220a for exhausting air. A crossed portion of every two crossed grooves 222a defines a through hole 26a. Obviously, when the ornamental element 10 of the first embodiment is applied to the depressed portion 220a, air between the depressed portion 220a and the ornamental element 10 can be vented outside of the shell 20a via the plurality of crossed grooves 222a and the through holes 26a.

It is believed that the present embodiments and their advantages will be understood from the foregoing description, and it will be apparent that various changes may be made thereto without departing from the spirit and scope of the description or sacrificing all of its material advantages, the examples hereinbefore described merely being exemplary embodiment.

What is claimed is:

1. A shell assembly comprising:
   a shell comprising a main body with a depressed portion, a sidewall slantingly extending from a side of the depressed portion, and a connection portion connected between the depressed portion and the sidewall, wherein the depressed portion defines a ornamental area, a plurality of crossed grooves are defined in the ornamental area, a crossed portion of every two crossed grooves defines a through hole, and the sidewall defines a plurality of slots communicating with the corresponding grooves;
   an ornamental element attached to the ornamental area of the main body.

2. The shell assembly as claimed in claim 1, wherein the plurality of crossed grooves are arranged as a grid-shaped structure.

3. The shell assembly of claim 1, wherein the plurality of slots are arranged as a grid-shaped structure.

4. The shell assembly of claim 1, wherein the ornamental element comprises an adhesive surface for attaching the ornamental element to the ornamental area.

5. A shell assembly, comprising:
   a protective shell of an electronic device comprising an ornamental area formed thereon; wherein the ornamental area comprises a plurality of crossed grooves defined therein, and a through hole defined in a crossed portion of every two crossed grooves; and wherein the grooves extend to an edge of the shell to communicate with an outside of the shell, and the through holes communicate with an inside of the shell;
   an ornamental element attached to the ornamental area of the shell, and covering the crossed grooves, wherein air between the ornamental area and the ornamental element is vented via the crossed grooves and the through holes.

6. The shell assembly of claim 5, wherein the plurality of crossed grooves are arranged as a grid-shaped structure.

7. The shell assembly of claim 5, wherein the ornamental area is a depressed portion formed in the shell, and the ornamental element is received in the depressed portion.

8. The shell assembly of claim 7, wherein the shell comprises a sidewall slantingly extends from an edge of the depressed portion.

9. The shell assembly of claim 8, wherein the sidewall defines a plurality of slots communicating with the corresponding grooves.

10. The shell assembly of claim 9, wherein the plurality of slots are arranged as a grid-shaped structure.

11. The shell assembly of claim 5, wherein the ornamental element comprises an adhesive surface for attaching the ornamental element to the ornamental area.

* * * * *